United States Patent [19]

Kato et al.

[11] Patent Number: 5,889,801
[45] Date of Patent: Mar. 30, 1999

[54] DRIVING METHOD FOR TUNABLE SEMICONDUCTOR LASER DIODE, TUNABLE LIGHT SOURCE DEVICE AND DRIVING METHOD FOR THE SAME

[75] Inventors: Tomoaki Kato, Tokyo; Yoshiaki Yamada, Kanagawa, both of Japan

[73] Assignees: NEC Corporation; Nippon Telegraph and Telephone Corporation, both of Tokyo, Japan

[21] Appl. No.: 919,308

[22] Filed: Aug. 28, 1997

[30] Foreign Application Priority Data

Feb. 14, 1997 [JP] Japan .................................. 9-030267

[51] Int. Cl.$^6$ .............................. H01S 3/10; H01S 3/00; H01S 3/19
[52] U.S. Cl. .............................. 372/20; 372/26; 372/38; 372/50
[58] Field of Search ................................ 372/20, 38, 45, 372/28, 50, 26, 96

[56] References Cited

U.S. PATENT DOCUMENTS

| | | | |
|---|---|---|---|
| 4,719,636 | 1/1988 | Yamaguchi et al. | 372/50 |
| 4,823,352 | 4/1989 | Sugimoto | 372/45 |
| 4,873,691 | 10/1989 | Uomi et al. | 372/20 |
| 4,920,542 | 4/1990 | Brosson et al. | 372/50 |
| 5,541,945 | 7/1996 | Yamaguchi et al. | 372/20 |

*Primary Examiner*—Rodney Bovernick
*Assistant Examiner*—Quyen Phan Leung
*Attorney, Agent, or Firm*—Sughrue, Mion, Zinn, Macpeak & Seas, PLLC

[57] ABSTRACT

A driving method for a tunable semiconductor laser which is remarkably effective for realizing high speed and stable wavelength switching is presented. Generally, when a single longitudinal mode laser oscillation wavelength of a tunable semiconductor laser diode comprising an active region and a wavelength control region is switched from $\lambda_1$ to $\lambda_2$, a wavelength control current ($\lambda$-Control) supplied to the wavelength control region is switched from $I_1$ to $I_2$. In the driving method according to the present invention, an active layer current (Active) supplied to the active region is temporarily decreased below a predetermined value during a predetermined period, in order to temporarily stop the single longitudinal mode laser oscillation of the laser diode. Preferably, the length of the predetermined period is set longer both before and after the moment of the wavelength control current switching than at least the carrier lifetime in the wavelength control region, and the predetermined value of the active layer current is set below threshold currents of all longitudinal modes existing between longitudinal modes corresponding to oscillation wavelengths before and after the wavelength control current switching. According to the driving method, oscillations at undesirable longitudinal modes are prevented, and thus stable high speed wavelength switchings precisely following supplied wavelength control signals are made possible even in a laser such as a tunable DBR laser diode involving longitudinal mode hops.

24 Claims, 9 Drawing Sheets

LACT= 72mA(constant)

72mA → 43.8mA
20nsec/div

DRIVING METHOD FOR TUNABLE SEMICONDUCTOR LASER DIODE, TUNABLE LIGHT SOURCE DEVICE AND DRIVING METHOD FOR THE SAME

BACKGROUND OF THE INVENTION

The present invention relates to a driving method for a tunable semiconductor laser diode, a tunable light source device, and a driving method thereof, in particular, to a device and a driving method capable of realizing high speed and stable switching of laser oscillation wavelength.

DESCRIPTION OF THE PRIOR ART

In recent years, in order to handle steadily increasing line traffic of communication data, development of switches having tera-bit(Tbps) class high throughput is needed, and optical switch networks capable of realizing switching of large capacity data paths with compact hardware is increasingly expected. Especially, the recent remarkable progress in optical wavelength filters and tunable light source devices is providing a new possibility of an optical switch applying wavelength division multiplexing (WDM) technique.

In order to realize a high speed optical wavelength switch based on optical cells utilizing the WDM technique, a tunable (variable wavelength) light source device provided with high speed wavelength switching ability of nanosecond order is indispensable. As the beam source of the device, use of a tunable distributed Bragg reflector semiconductor laser diode (tunable DBR laser) designed to expand the tuning range utilizing mode hops is possible.

A tunable semiconductor laser diode comprises an active region for realizing laser oscillation and a wavelength control region for controlling the laser oscillation wavelength. In a conventional driving method for tunable semiconductor laser diodes, for changing (coarse tuning) the laser oscillation wavelength, the laser is kept in a state of single longitudinal mode laser oscillation with an electric current passed through the active region greater than the threshold current, and the effective refractive index of the wavelength control region is electrically controlled by changing the wavelength control current passed through the wavelength control region. Incidentally, the coarse tuning of the laser oscillation wavelength is necessitated to involve mode hops as shown in FIG. 1.

The above-mentioned coarse tuning function of the conventional tunable semiconductor laser diodes is advantageous for expanding the range of the tunable semiconductor laser diodes. However, when the laser oscillation wavelength is tuned or switched, if a longitudinal mode of a wavelength before switching and a longitudinal mode of a wavelength after switching are different form each other, the coarse tuning is necessitated to involve a mode hop. On the switching, in the case where the laser oscillation has to go across other longitudinal modes existing between the longitudinal mode corresponding to the wavelength before switching and the longitudinal mode corresponding to the wavelength after switching, the oscillation is 'mode trapped' by the intermediate longitudinal modes. In other words, when the oscillation approaches a capture range of an intermediate longitudinal mode, stimulated emission starts at the intermediate longitudinal mode and is attracted to the mode, and its lasing wavelength is trapped in the intermediate longitudinal mode for a period according to the stability of the oscillation at the intermediate longitudinal mode.

Figure 1:
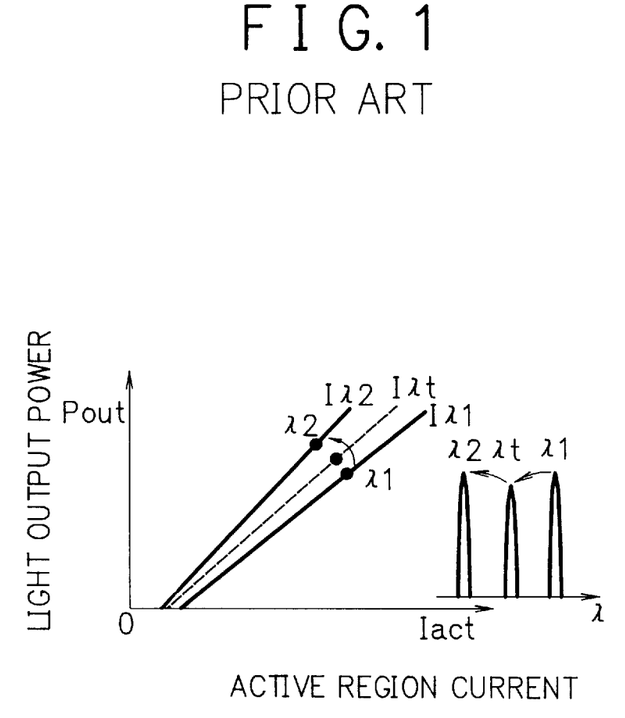
FIG. 1 is a schematic diagram showing the mode hops due to wavelength switching according to conventional driving method for a tunable semiconductor laser diode.

In the case where a tunable semiconductor laser diode is oscillating at an oscillation wavelength $\lambda_1$ supplied with a wavelength control current I $\lambda_1$ and then the wavelength control current is switched from I $\lambda_1$ to I $\lambda_2$ in order to switch the oscillation wavelength $\lambda_1$ to $\lambda_2$, there exists a period in which the tunable semiconductor laser diode oscillates at an intermediate oscillation wavelength A , as shown in FIG. 1, in short, the laser oscillation wavelength can not follow the switching of the wavelength control current in the conventional tunable semiconductor laser diode. When this kind of mode trap occurs, as seen in a time-averaged spectrum shown in FIG. 9A, a plurality of a little lower peaks appear between two oscillation axial modes corresponding to two laser oscillation wavelengths before and after the wavelength control current switching, showing the occurrence of the mode traps. This mode trap phenomenon is fatal to devices which are needed high speed optical wavelength switching, however no effective solution to the mode trap phenomenon has been proposed.

With all the above-mentioned difficulties, the possibility of wavelength switching technique which can be developed by the tunable semiconductor laser diodes having wide wavelength tuning characteristics is still fascinating. Therefore, a measure for preventing the mode trap is indispensable for the use of the tunable semiconductor laser diode.

SUMMARY OF THE INVENTION

It is therefore the primary object of the present invention to provide a measure for effectively preventing the above-mentioned mode trap phenomenon, and to realize a high speed and stable wavelength switching characteristic in the tunable semiconductor laser diode.

In accordance with the present invention, there is provided a driving method for a tunable semiconductor laser diode in which an active region and a wavelength control region of the laser are supplied with independent control currents and the oscillation wavelength of the laser diode is switched by switching a wavelength control current supplied to the wavelength control region, wherein the following operation is executed on the switching of the wavelength control current. First, the single longitudinal mode laser oscillation of the tunable semiconductor laser is temporarily stopped by decreasing an active layer current supplied to the active region below a predetermined value. Then, the wavelength control current is switched. And subsequently, the active layer current is returned to the original value.

Preferably, the length of the period in which the active layer current is lowered is set longer both before and after the moment of the switching of the wavelength control current than at least the carrier lifetime in the wavelength control region.

Preferably, the length of the period in which the active layer current is lowered is set longer both before and after the moment of the wavelength switching than at least a period needed for the carrier density variation in the wavelength control region to be stabilized at a stationary state corresponding to an oscillation wavelength after the wavelength control current switching.

Preferably, the predetermined value of the active layer current is set below threshold currents corresponding to oscillation wavelengths before and after the wavelength control current switching.

Preferably, the predetermined value of the active layer current is set below oscillation threshold currents of all longitudinal modes existing between longitudinal modes corresponding to oscillation wavelengths before and after the wavelength control current switching.

In accordance with another aspect of the present invention, there is provided a tunable light source device comprising a tunable semiconductor laser diode including an active region and a wavelength control region, and a driver means for supplying an active layer current to the active region and supplying a wavelength control current to the wavelength control region respectively and switching the oscillation wavelength of the laser by switching the wavelength control current. The driver means includes a wavelength switching control means for temporarily stopping the single longitudinal mode laser oscillation of the tunable semiconductor laser diode by decreasing the active layer current supplied to the active region below a predetermined value, on the switching of the wavelength control current.

Preferably, the wavelength switching control means decreases the active layer current below the predetermined value during a period, in which the length of the period before the moment of the switching of the wavelength control current and the length of the period after the moment of the switching of the wavelength control current are both set longer than at least the carrier lifetime in the wavelength control region.

Preferably, the wavelength switching control means decreases the active layer current below the predetermined value during a period, in which the length of the period before the moment of the switching of the wavelength control current and the length of the period after the moment of the switching of the wavelength control current are both set longer than at least a period needed for the carrier density variation in the wavelength control region to be stabilized at a stationary state corresponding to an oscillation wavelength after the wavelength control current switching.

Preferably, the wavelength switching control means decreases the active layer current below threshold currents corresponding to oscillation wavelengths before and after the wavelength control current switching.

Preferably, the wavelength switching control means decreases the active layer current below threshold currents of all longitudinal modes existing between longitudinal modes corresponding to oscillation wavelengths before and after the wavelength control current switching.

Preferably, the tunable semiconductor laser diode is a tunable distributed Bragg reflector semiconductor laser diode.

In accordance with another aspect of the present invention, there is provided a driving method for a tunable light source device. The tunable light source device is provided with a first and a second tunable semiconductor laser diodes in each of which an active region and a wavelength control region of the laser are supplied with independent control currents and the oscillation wavelength of the laser is switched by switching a wavelength control current supplied to the wavelength control region, a first and a second optical gate switches for transmitting/absorbing light output signals from the first and the second tunable semiconductor laser diodes respectively, and an optical combiner for combining the light output signals from the first and the second optical gate switches and outputting the combined. On the switching of the oscillation wavelength of the first tunable semiconductor laser diode, the driving control circuit controls to keep the oscillation wavelength of the second tunable semiconductor laser diode fixed and controls to keep the first and the second optical gate switches in the absorbing state and the transmitting state respectively, on the switching of the oscillation wavelength of the second tunable semiconductor laser diode, the driving control circuit controls to keep the oscillation wavelength of the first tunable semiconductor laser diode fixed and controls to keep the first and the second optical gate switches in the transmitting state and the absorbing state respectively. And on the switching of the wavelength control current of either of the first and the second tunable semiconductor laser diode, the following operation is further executed in the tunable semiconductor laser whose wavelength control current is switched. First, the single longitudinal mode laser oscillation of the tunable semiconductor laser diode is temporarily stopped by decreasing an active layer current supplied to the active region below a predetermined value. Then, the wavelength control current is switched. And subsequently, the active layer current is returned to the original value.

Preferably, the wavelength switching of the first tunable semiconductor laser diode is executed with a predetermined period and the wavelength switching of the second tunable semiconductor laser diode is executed with the same period and with a shifted phase by half of the period compared to the first tunable semiconductor laser diode, and the switchings of the transmitting/absorbing states of the first and the second optical gate switches are executed so that the first and the second optical gate switches become in the transmitting state alternately with a period of the length of half the predetermined period.

Preferably, the length of the period in which the active layer current is lowered is set longer both before and after the moment of the switching of the wavelength control current than at least the carrier lifetime in the wavelength control region.

Preferably, the length of the period in which the active layer current is lowered is set longer both before and after the moment of the switching of the wavelength control current than at least a period needed for the carrier density variation in the wavelength control region to be stabilized at a stationary state corresponding to an oscillation wavelength after the wavelength control current switching.

Preferably, the predetermined value of the active layer current is set below threshold currents corresponding to oscillation wavelengths before and after the wavelength control current switching.

Preferably, the predetermined value of the active layer current is set below threshold currents of all longitudinal modes existing between longitudinal modes corresponding to oscillation wavelengths before and after the wavelength control current switching.

In accordance with another aspect of the present invention, there is provided a tunable light source device comprising a first and a second tunable semiconductor laser diodes each of which including an active region and a wavelength control region, a first and a second optical gate switches for transmitting/absorbing light output signals from the first and the second tunable semiconductor laser diodes respectively, an optical combiner for combining the light output signals from the first and the second optical gate switches and outputting the combined, and a driving control circuit for controlling the oscillation wavelengths of the first and the second tunable semiconductor laser diodes and the transmitting/absorbing states of the first and the second optical gate switches. On the switching of the oscillation wavelength of the first tunable semiconductor laser diode, the driving control circuit controls to keep the oscillation wavelength of the second tunable semiconductor laser diode fixed and controls to keep the first and the second optical gate switches in the absorbing state and the transmitting state respectively. On the switching of the oscillation wavelength of the second tunable semiconductor laser diode, the driving control circuit controls to keep the oscillation wavelength of the first tunable semiconductor laser diode fixed and controls to keep the first and the second optical gate switches in the transmitting state and the absorbing state respectively. And the driving control circuit includes a wavelength switching control means for temporarily stopping the single longitudinal mode laser oscillation of the first tunable semiconductor laser diode by decreasing an active layer current supplied to an active region of the laser diode below a predetermined value on the switching of a wavelength control current of the first tunable semiconductor laser diode, and temporarily stopping the single longitudinal mode laser oscillation of the second tunable semiconductor laser diode by decreasing an active layer current supplied to an active region of the laser diode below a predetermined value on the switching of a wavelength control current of the second tunable semiconductor laser diode.

Preferably, the wavelength switching control means executes the wavelength switching of the first tunable semiconductor laser diode with a predetermined period, executes the wavelength switching of the second tunable semiconductor laser diode with the same period and with a shifted phase by half of the period compared to the first tunable semiconductor laser diode, and executes the switchings of the transmitting/absorbing states of the first and the second optical gate switches so that the first and the second optical gate switches become in the transmitting state alternately with a period of the length of half the predetermined period.

Preferably, the length of the period in which the active layer current is decreased by the wavelength switching control means is set longer both before and after the moment of the switching of the wavelength control current than at least the carrier lifetime in the wavelength control region.

Preferably, the length of the period in which the active layer current is lowered by the wavelength switching control means is set longer both before and after the moment of the switching of the wavelength control current than at least a period needed for the carrier density variation in the wavelength control region to be stabilized at a stationary state corresponding to an oscillation wavelength after the wavelength control current switching.

Preferably, the wavelength switching control means decreases the active layer current below threshold currents corresponding to oscillation wavelengths before and after the wavelength control current switching.

Preferably, the wavelength switching control means decreases the active layer current below threshold currents of all longitudinal modes existing between longitudinal modes corresponding to oscillation wavelengths before and after the wavelength control current switching.

Preferably, the first and the second tunable semiconductor laser diodes are tunable distributed Bragg reflector semiconductor laser diodes.

BRIEF DESCRIPTION OF THE DRAWINGS

The objects and features of the present invention will become more apparent from the consideration of the following detailed description taken in conjunction with the accompanying drawings, in which.

DESCRIPTION OF THE PREFERRED EMBODIMENTS

Referring now to the drawings, a description will be given in detail of preferred embodiments in accordance with the present invention.

At the outset, the principle of the present invention will be explained.

The mode trap phenomenon can be considered as a phenomenon in which a semiconductor laser diode tends to shift into a stable state by causing stimulated emission (i.e. laser oscillation) for itself, in brief, the semiconductor laser diode tends to stay on a comfortable mode. Therefore, in order to utilize the tunable semiconductor laser diode involving the mode hop, suppressing the mode trap to a harmless level for practical use is an sufficient and effective measure. In other words, it is an sufficient and effective measure to intentionally break the stability of the longitudinal mode which causes the mode trap. And such an unstable state can be easily realized by temporarily decreasing the current passed through the active region below the threshold current and thereby temporarily creating a state under the threshold oscillation gain of the longitudinal mode which contributes the mode trap, in the transition stage at the switching of the single longitudinal mode oscillation wavelength.

More concretely, it is an sufficient and effective measure to decrease the current passed through the active region below the threshold current value during a longer period than at least the carrier lifetime and thereby intentionally create a state (a 'dark' state) where the semiconductor laser diode can not cause stimulated emission for itself, and execute the wavelength switching by controlling the wavelength control current in the dark state. As mentioned above, the driving method of the present invention for the tunable semiconductor laser diode is characterized by the switching of the wavelength control current in the dark state where the oscillation is stopped, and thus in the following, this driving method is referred to as 'shadow tuning'.

Figure 2:
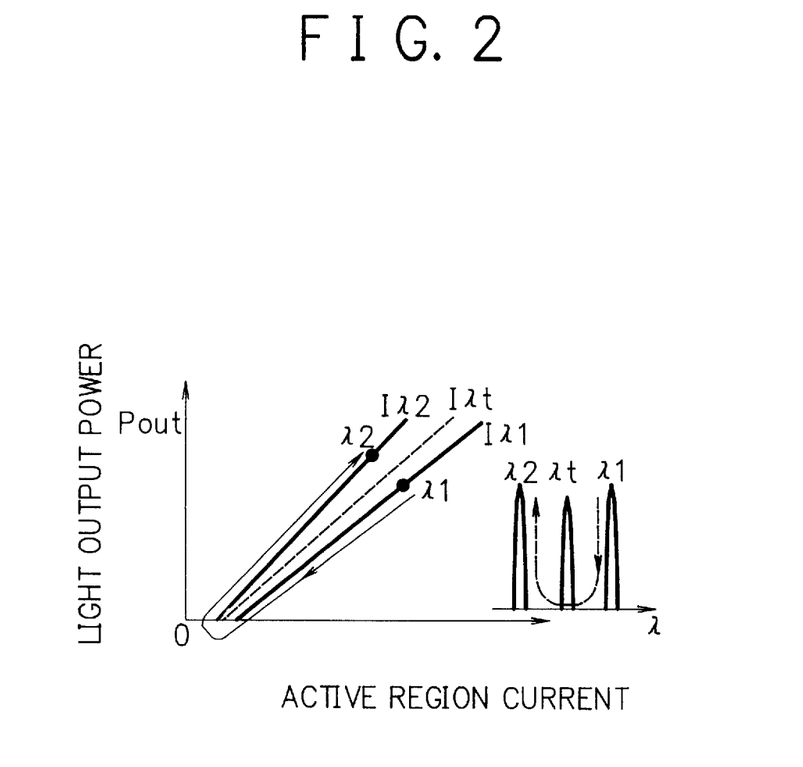
FIG. 2 is a schematic diagram showing the principle of the present invention.

The wavelength switching method is easy to understand with reference to FIG. 2. FIG. 2 is a schematic diagram showing a characteristic (L-I characteristic) between the output beam power and the current of two different laser longitudinal modes of a tunable semiconductor laser diode. In the wavelength switching method, the operating point on the L-I characteristic at the wavelength switching is temporarily moved along the L-I curve into the position under the threshold value first, and then in the dark state where laser oscillation is stopped, the wavelength switching is executed by controlling the wavelength control current. By the method shown above, switching of the laser oscillation wavelength without the mode trap is realized.

In the following, the first embodiment of the present invention will be described in detail with reference to FIG. 3 and FIG. 4.

Figure 3:
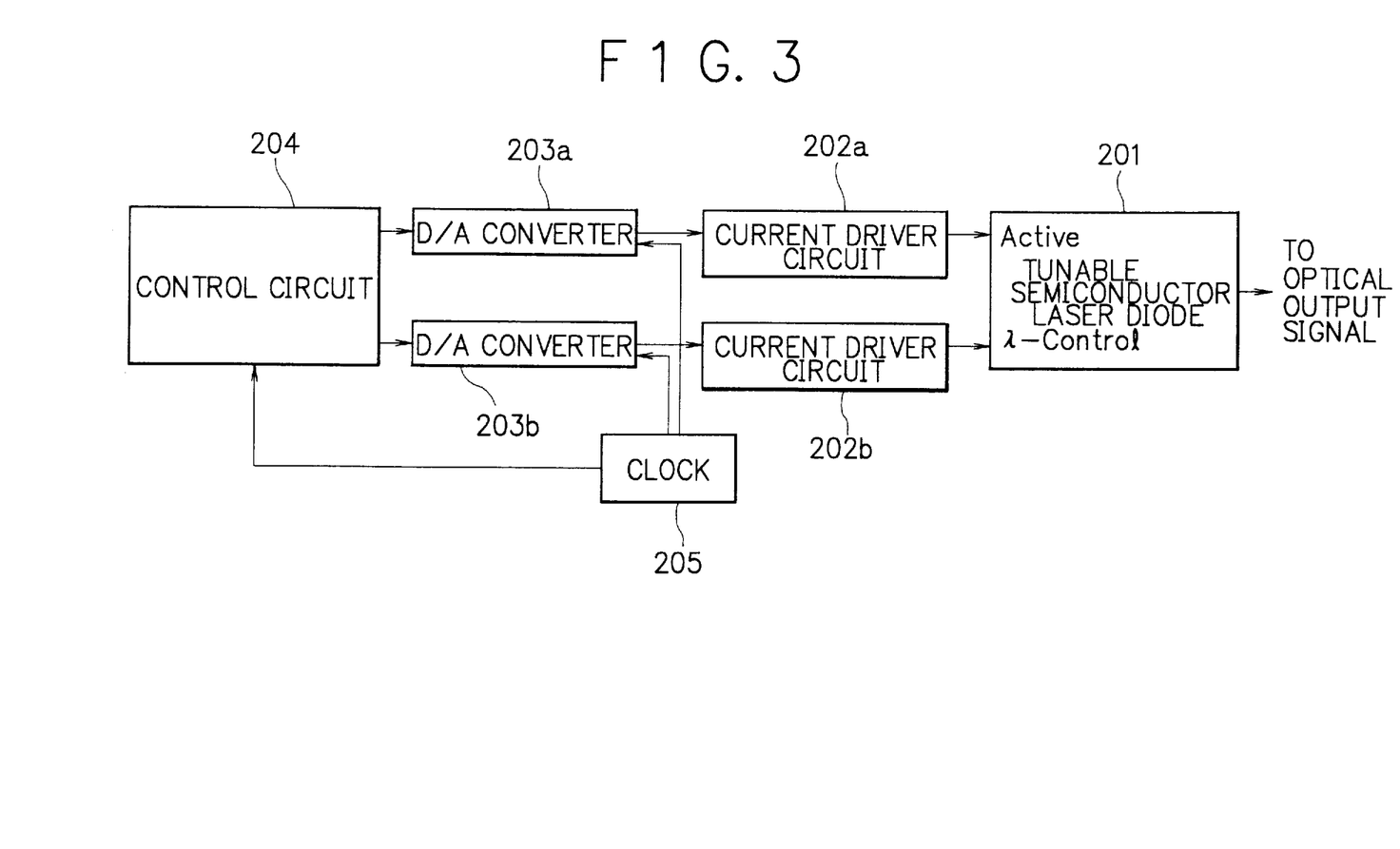
FIG. 3 is a block diagram showing the first embodiment of the present invention.
Figure 4:
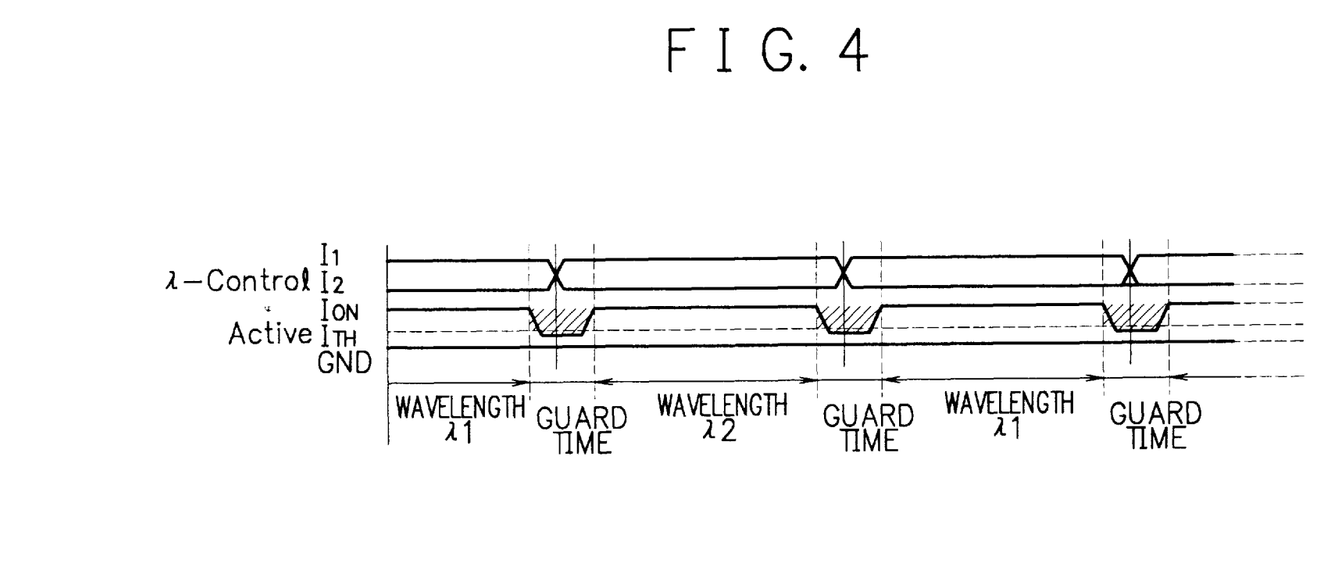
FIG. 4 is a timing chart showing the operation of the tunable light source device of FIG. 3.

FIG. 3 shows a block diagram of a tunable light source device according to this embodiment. The tunable light source device comprises a tunable semiconductor laser diode 201, current driver circuits 202a and 202b, D/A converters 203a and 203b, a control circuit 204, and a clock 205.

The tunable semiconductor laser diode 201 is, for example, a tunable DBR laser diode and includes an active region and a wavelength control region. An active layer electrode (Active) and a wavelength control electrode (λ-control) are provided to the active region and the wavelength control region respectively. The number of the wavelength control electrode varies according to the type of the laser diode 201, and more than one wavelength control electrodes are provided to some types of laser diodes in order to realize phase control of oscillation.

The control circuit 204 outputs digital data for controlling an active layer current supplied to the active layer electrode and a wavelength control current supplied to the wavelength control electrode synchronized with a clock signal sent from the clock 205.

The D/A converters 203a and 203b are high speed and high precision converters which operate synchronized with the control circuit 204 i.e. synchronized with the clock signal, which convert the digital data sent from the control circuit 204 to analog signals and send the analog signals to the current driver circuits 202a and 202b.

The current driver circuits 202a and 202b supply the active layer current and the wavelength control current which are determined by the analog signals sent from the D/A converters 203a and 203b to the active layer electrode and the wavelength control electrode respectively, and thereby control the laser oscillation and the laser oscillation wavelength.

Incidentally, light output signal of the tunable semiconductor laser diode 201 is outputted from a facet in the side of the active region and is coupled to an optical fiber (not illustrated).

Next, the operation of the tunable light source device will be described with reference to FIG. 4. The active layer current $I_{ON}$ is supplied to the active layer electrode of the tunable semiconductor laser diode 201 in order to cause laser oscillation, and the wavelength control current is supplied to the wavelength control electrode in order to control the single longitudinal mode laser oscillation wavelength. Incidentally, a single longitudinal mode laser oscillation wavelength $\lambda_1$ is obtained when a wavelength control current $I_1$ is supplied to the wavelength control electrode, and a single longitudinal mode laser oscillation wavelength $\lambda_2$ is obtained when a wavelength control current $I_2$ is supplied to the wavelength control electrode. The wavelength control current $I_1$ and the wavelength control current $I_2$ are switched alternately with a predetermined period, and thereby the oscillation wavelength $\lambda_1$ and the oscillation wavelength $\lambda_2$ are switched alternately.

In the shadow tuning method of this embodiment, the active layer current is temporarily decreased before switching of the single longitudinal mode laser oscillation wavelength at least below threshold currents of single longitudinal mode laser oscillation wavelengths before and after the switching. Preferably, the active layer current is temporarily decreased below a threshold current $I_{TH}$ which is the lowest value in threshold currents of longitudinal modes existing between the single longitudinal mode laser oscillation wavelength before the switching and the single longitudinal mode laser oscillation wavelength after the switching.

The purpose of temporarily decreasing the active layer current before the moment of wavelength switching is to prevent the appearance of the fluctuation of the single longitudinal mode laser oscillation wavelength due to the fluctuation of carrier density in the wavelength control region at the switching of the wavelength control current. For the purpose, the timing of decreasing the active layer current is set to the point before the moment of the wavelength switching by at least a longer period than the carrier lifetime in the wavelength control region. Or, the timing of decreasing the active layer current is set to the point before the moment of the wavelength switching by a period needed for the carrier density variation in the wavelength control region to be stabilized in a stationary state.

A predetermined time after the switching of the oscillation wavelength, the active layer current is raised again to the operating point for the wavelength after switching. The length of the predetermined time is set longer than at least the carrier lifetime in the wavelength control region for the aforementioned reason. Or, it is set longer than a period needed for the carrier density variation in the wavelength control region to be stabilized at a stationary state corresponding to an oscillation wavelength after the wavelength control current switching.

As shown above, the period in which the laser oscillation wavelength is in unstable state, including the period where the active layer current is decreased below the threshold current $I_{TH}$, can be treated as a 'switching guard time' shown in FIG. 4 in which light output signal of the tunable semiconductor laser diode 201 is invalidated.

By decreasing the active layer current below the threshold current $I_{TH}$ at the wavelength switching, beam output of laser oscillation can not be obtained during the period, however, the transitional mode trap phenomenon involved in the switching of the wavelength control current can be suppressed and the aforementioned instability problem of the beam output of single mode laser oscillation around the wavelength switching is resolved.

Incidentally, stability of single longitudinal mode laser oscillation wavelength is expected to vary between operating points and according to tunable light source devices. In practical use, stability of the single longitudinal mode laser oscillation wavelength at each operating point is a necessary condition for the use of the present invention, and thus it is necessary to preliminarily check whether or not desired single longitudinal mode laser oscillation wavelengths are stable. Fortunately, as long as the single longitudinal mode laser oscillation wavelength after wavelength switching is equal to that before switching, the driving method for a tunable semiconductor laser diode according to this embodiment is equivalent to direct modulation of the active layer current of the tunable semiconductor laser diode. From this standpoint, following method is a sufficient method for preliminarily and easily checking whether or not the single longitudinal mode laser oscillation wavelength is stable. First, the active layer current is directly modulated with the same current amplitude and duty rate (current(high)/current (low)) as those in the process of shadow tuning. Then, it is checked whether or not an oscillation spectrum of the tunable semiconductor laser diode 201 indicates a stable single longitudinal mode laser oscillation.

In the following, the second embodiment of the present invention will be described in detail with reference to FIG. 5 and FIG. 6.

The tunable light source device according to the second embodiment comprises a first tunable semiconductor laser diode 401a, a second tunable semiconductor laser diode 401b, current driver circuits 402a, 402b, 402c and 402d, D/A converters 403a, 403b, 403c and 403d, a control circuit 404, a clock 405, a first optical gate switch 406a, a second optical gate switch 406b, and an optical combiner or optical coupler 407.

Figure 5:
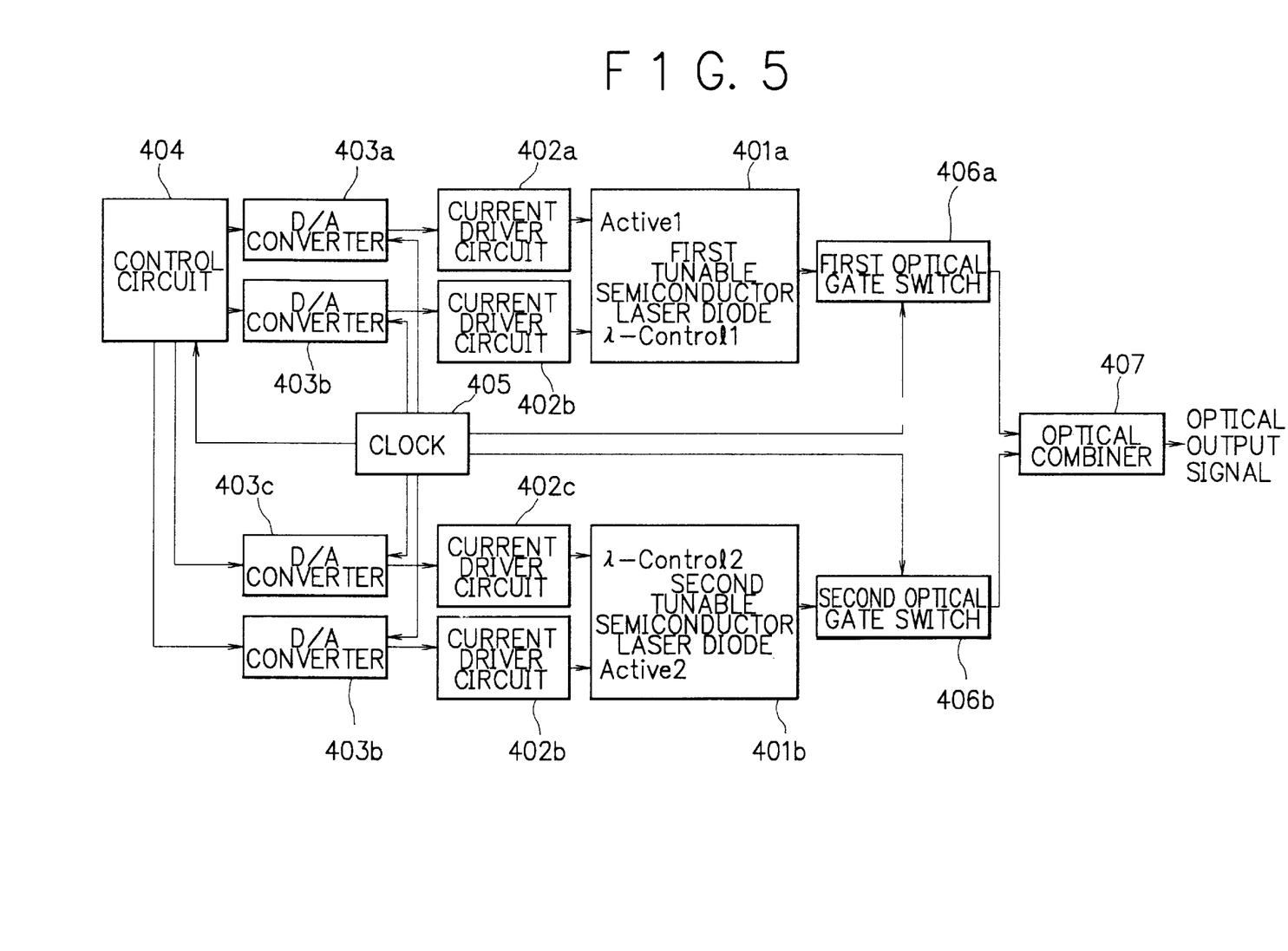
FIG. 5 is a block diagram showing the first embodiment of the present invention.
Figure 6:
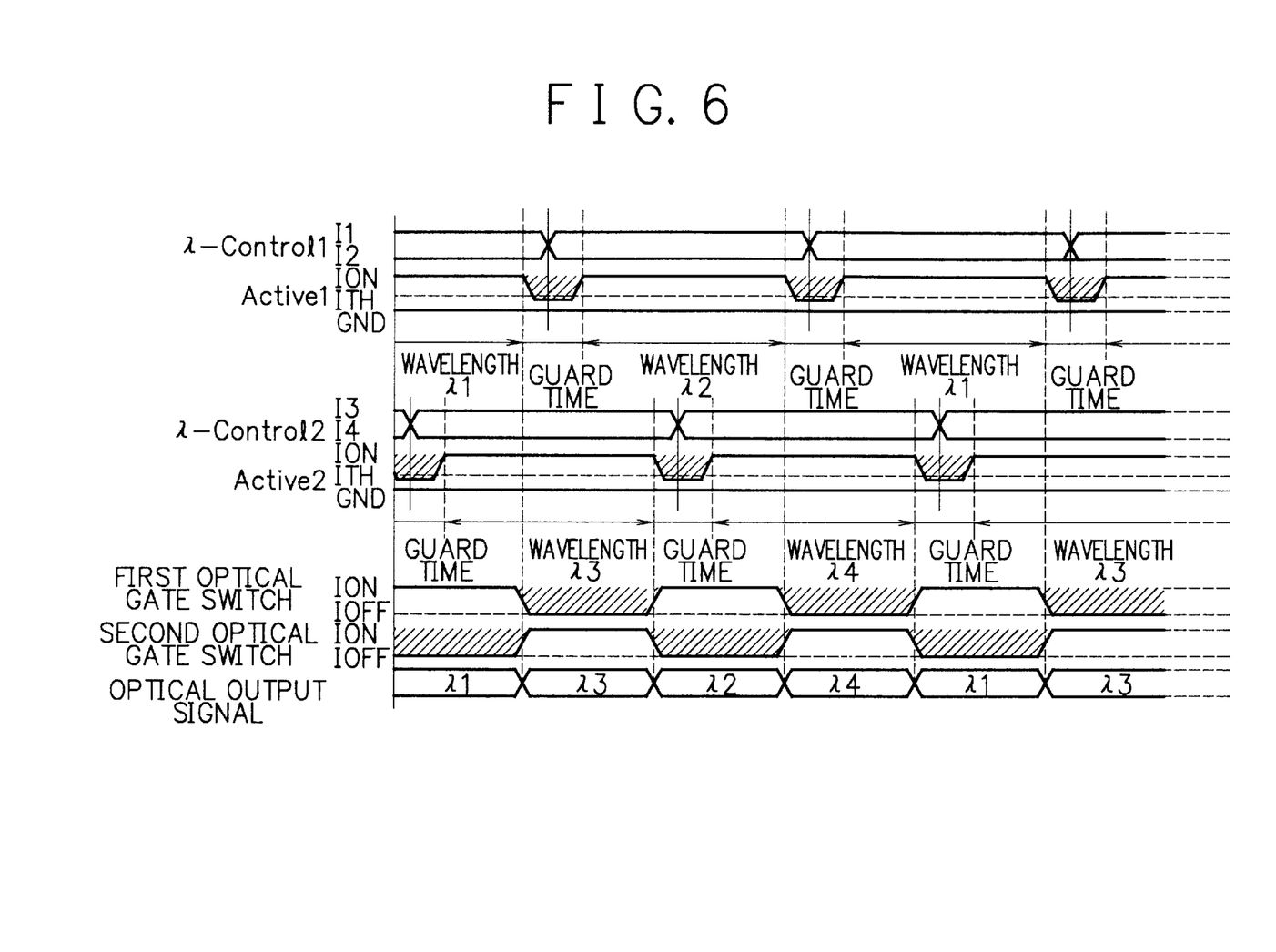
FIG. 6 is a timing chart showing the operation of the tunable light source device of FIG. 5.

The tunable light source device in FIG. 5 can basically be considered as a device in which two tunable light source devices of the first embodiment are connected together. However, oscillations and oscillation wavelengths of the first and the second tunable semiconductor laser diodes 401a and 401b are controlled by one control circuit 404. The light output signals from the first and the second tunable semiconductor laser diodes 401a and 401b are inputted into the optical combiner 407 via the first and the second optical gate switches 406a and 406b respectively.

The first and the second optical gate switches 406a and 406b are connected to the clock 405 which supplies common clocks to the D/A converters 403a, 403b, 403c, 403d and the control circuit 404, and are supplied with the same clocks. Each of the optical gate switches 406a and 406b is designed to switch between a transmission state and an absorption state according to gate control signals. In this embodiment, the clock signal supplied by the clock 405 is utilized as the gate control signal, and the transmission state and the absorption state of the first and the second optical gate switches 406a and 406b are switched synchronized with the operation of the first and the second tunable semiconductor laser diodes 401a and 401b respectively with a predetermined period.

Next, the operation of the tunable light source device of FIG. 5 will be described with reference to FIG. 6.

In the first tunable semiconductor laser diode 401a, an active layer current $I_{ON}$ is supplied to the active layer electrode (Active 1) in order to cause laser oscillation, and a wavelength control current is supplied to the wavelength control electrode (λ-control 1) in order to control the single longitudinal mode laser oscillation wavelength of the laser diode 401a. A single longitudinal mode laser oscillation wavelength $\lambda_1$ is obtained when a wavelength control current $I_1$ is supplied to the wavelength control electrode (λ-control 1), and a single longitudinal mode laser oscillation wavelength $\lambda_2$ is obtained when a wavelength control current $I_2$ is supplied to the wavelength control electrode (λ-control 1). The wavelength control currents $I_1$ and $I_2$ are switched alternately with a predetermined period, and thereby the oscillation wavelengths $\lambda_1$ and $\lambda_2$ are switched alternately. Similarly, in the second tunable semiconductor laser diode 401b, an active layer current $I_{ON}$ is supplied to the active layer electrode (Active 2) in order to cause laser oscillation, and a wavelength control current is supplied to the wavelength control electrode (λ-control 2) in order to control the single longitudinal mode laser oscillation wavelength of the laser diode 401b. A single longitudinal mode laser oscillation wavelength $\lambda_3$ is obtained when a wavelength control current $I_3$ is supplied to the wavelength control electrode (λ-control 2), and a single longitudinal mode laser oscillation wavelength $\lambda_4$ is obtained when a wavelength control current $I_4$ is supplied to the wavelength control electrode (λ-control 2). The wavelength control currents $I_3$ and $I_4$ are switched alternately with a predetermined period, and thereby the oscillation wavelengths $\lambda_3$ and $\lambda_4$ are switched alternately.

In the same way as the first embodiment, in each of the first and the second tunable semiconductor laser diodes 401a and 401b, the active layer current is temporarily decreased around the moment of the wavelength control current switching, below a threshold current $I_{TH}$ which is the lowest value in threshold currents of longitudinal modes existing between the single longitudinal mode laser oscillation wavelength before the switching and the single longitudinal mode laser oscillation wavelength after the switching, i.e. the shadow tuning is executed. The length of the period of shadow tuning is set longer both before and after the moment of wavelength switching than at least the carrier lifetime in the wavelength control region, also in the same way as the first embodiment. By the shadow tuning process, the mode trap phenomenon involved in the switching of the wavelength control current can be suppressed, and instability of beam output of single mode laser oscillation is prevented in each of the first and the second tunable semiconductor laser diodes 401a and 401b.

Incidentally, as mentioned in the first embodiment, when the shadow tuning is executed, beam output of laser oscillation can not be obtained during the period of wavelength switching.

In order to resolve the above problem, in this embodiment, the timing of the wavelength switching in the first tunable semiconductor laser diode 401a and that in the second tunable semiconductor laser diode 401b are shifted or staggered from each other. In FIG. 6, for example, the periods of wavelength switchings in the first tunable semiconductor laser diode 401a and the second tunable semiconductor laser diode 401b are set equal in length, and are set shifted from each other by half a period in timing. By shifting the timing of wavelength switchings of two tunable semiconductor laser diodes as above, laser oscillation beam output from one of tunable semiconductor laser diodes 401a, 401b can at least be obtained constantly.

Furthermore in this embodiment, the first optical gate switch 406a and the second optical gate switch 406b are controlled to be in the transmission state alternately, and each of them is controlled to be in the absorption state when wavelength switching is executed in corresponding tunable semiconductor laser diode 401a or 401b, i.e. during the switching guard time. In other words, the length of the switching period of the first optical gate switch 406a is set equal to that of the second optical gate switch 406b, and each of the optical gate switches 406a and 406b is switched in the transmission state during a predetermined period after completion of the wavelength switching before the start of the next wavelength switching. Consequently, the optical combiner 407 receives the laser oscillation beam outputted from the first optical gate switch 406a and the laser oscillation beam outputted from the second optical gate switch 406b alternately and outputs them untouched. And as the result, laser oscillation beam output of one of the oscillation wavelengths $\lambda_1$, $\lambda_2$, $\lambda_3$, $\lambda_4$ can be obtained constantly as shown in FIG. 6.

According to the second embodiment, the wavelength switching of the first and the second tunable semiconductor laser diodes 401a and 401b, and the transmission/absorption state switching of the optical gate switches 406a and 406b are controlled as shown above, therefore laser oscillation beam output can be obtained constantly and high speed wavelength switching can be easily realized by setting a high switching frequency.

Incidentally, the oscillation wavelengths of the first tunable semiconductor laser diode 401a and those of the second tunable semiconductor laser diode 401b may be set either equal (i.e. $\lambda_1=\lambda_3$, $\lambda_2=\lambda_4$) or different.

In the following, another example according to the present invention will be described with reference to FIG. 7 through FIG. 9H. The example corresponds to the first embodiment.

Figure 7:
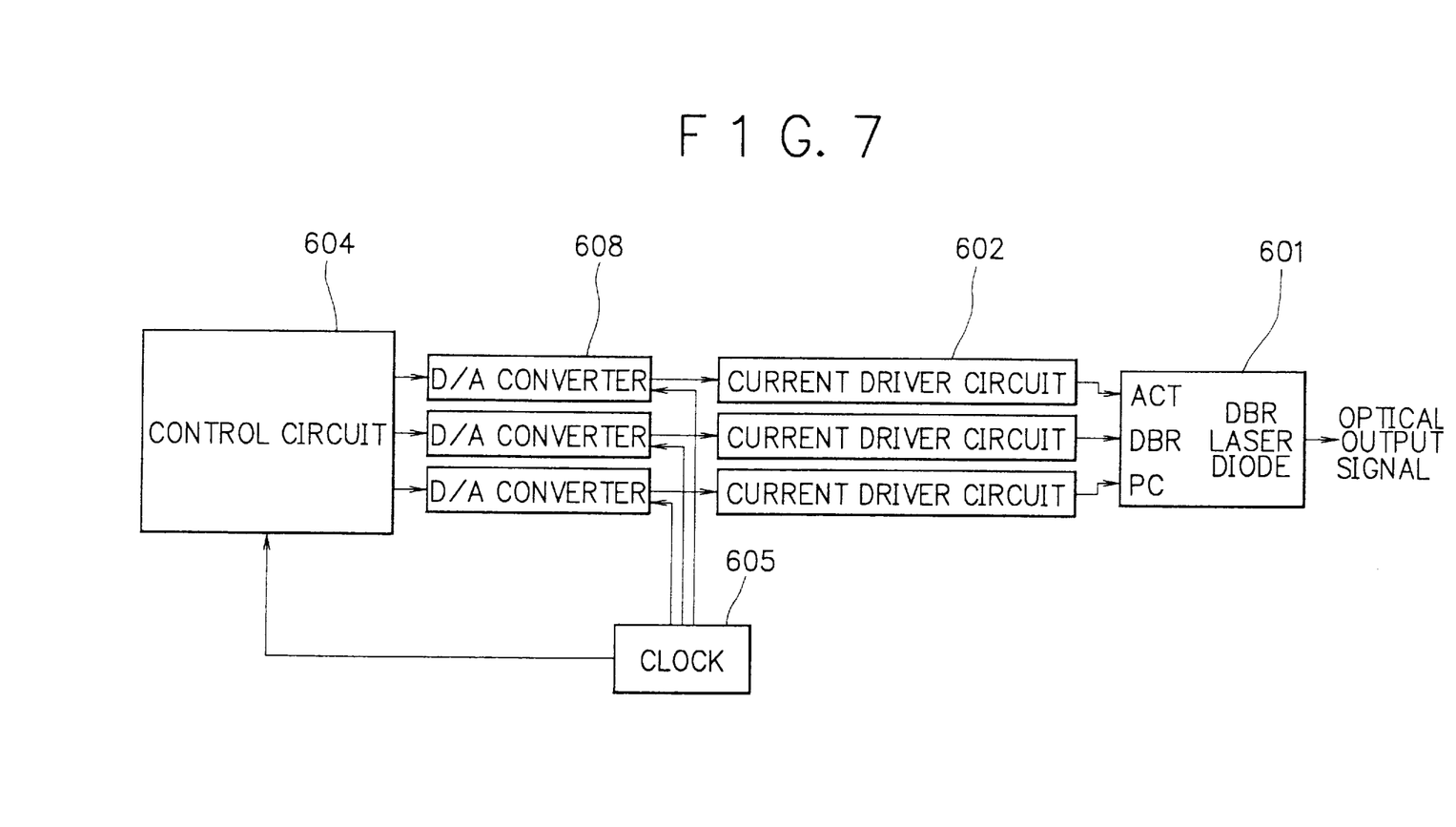
FIG. 7 is a block diagram showing an example of a tunable light source device according to the present invention.

As shown in FIG. 7, the tunable light source device of this example comprises a 3-electrodes tunable DBR laser diode 601 as the tunable semiconductor laser diode. The 3-electrodes tunable DBR laser diode 601 includes a DBR electrode (DBR) for coarse tuning and a phase control electrode (PC) for fine tuning as wavelength control electrodes, as well as an active layer electrode (ACT). Each electrode is connected to a corresponding current driver circuit 602, and each current driver circuit 602 is connected to a control circuit 604 via a corresponding D/A converter 603. And a clock 605 is connected to the control circuit 604 and the D/A converters 603.

The control circuit 604 outputs control signals for controlling each electrode synchronized with a common clock signal sent from the clock 605. Each D/A converter 603 converts each control signal sent from the control circuit 604 into an analog signal, according to the clock signal and synchronized with the control circuit 604. The output of each D/A converter 603 is transformed to a current signal by corresponding current driver circuit 602 and supplied to each electrode. In the tunable light source device of this example, currents supplied to the electrodes of the 3-electrodes tunable DBR laser diode 601 are thus controlled, and thereby single longitudinal mode laser oscillation with any desired wavelength is realized.

Figure 8:
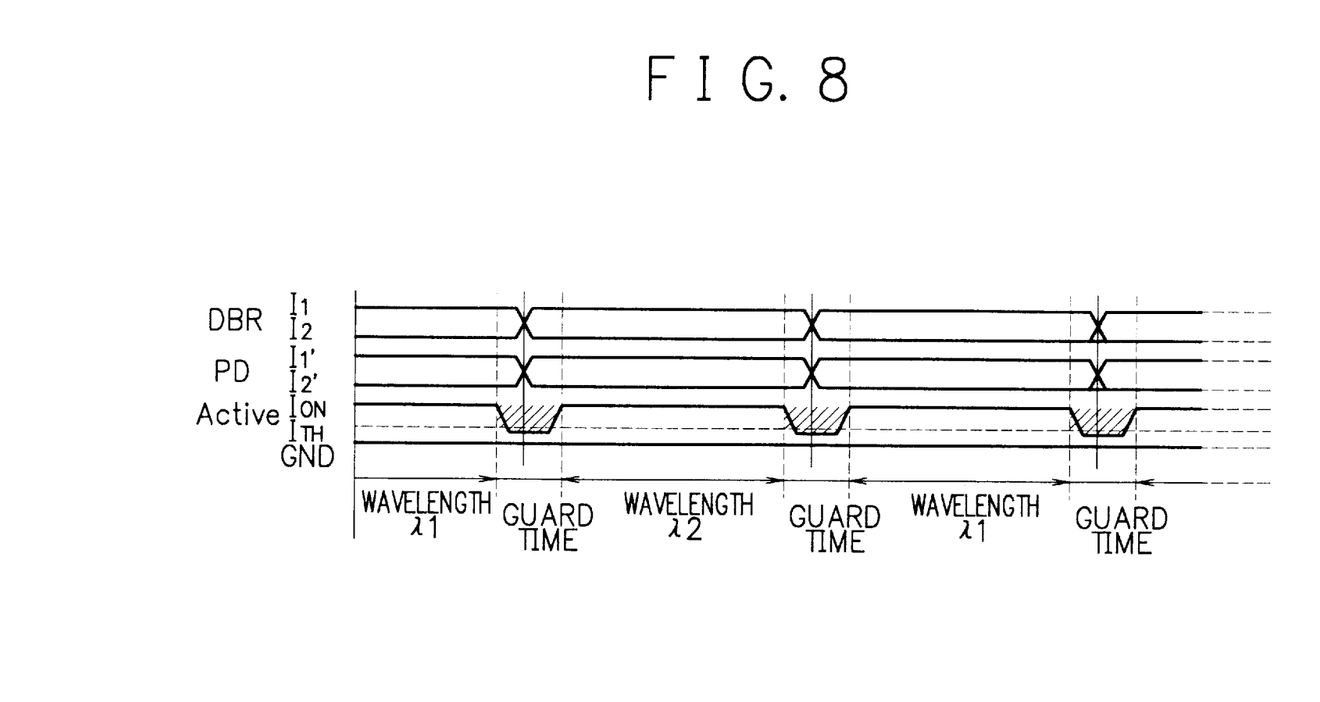
FIG. 8 is a timing chart showing the operation of the tunable light source device of FIG. 7.

In the tunable light source device of this example, as shown in FIG. 8, the oscillation wavelength of the 3-electrodes tunable DBR laser diode 601 is switched by switching the current supplied to the DBR electrode between $I_1$ and $I_2$ and by switching the current supplied to the PC electrode between $I_1'$ and $I_2'$. At the switching, the active layer current is temporarily decreased below a threshold current $I_{TH}$ which is the lowest value in threshold currents of longitudinal modes existing between the single longitudinal mode laser oscillation wavelength before the switching and the single longitudinal mode laser oscillation wavelength after the switching, i.e. the shadow tuning is executed, in the same way as the first and the second embodiment.

FIG. 9A through FIG. 9H show measurement results of characteristics of the tunable light source device of this example at a plurality of active layer currents.

First, a case will be explained in which the 3-electrodes tunable DBR laser diode 601 was driven by the widely used conventional driving method for tunable semiconductor laser diodes.

When currents of 72 mA, 10 mA, and 0 mA ware supplied to the active layer electrode, the DBR electrode, and the PC electrode of the tunable DBR laser diode 601 respectively, the laser diode 601 started a static single longitudinal mode oscillation with a wavelength of $\lambda_1=1552$ nm. By raising the current supplied to the DBR electrode from 10 mA to 20 mA, the static oscillation wavelength of the tunable DBR laser diode 601 switched to a shorter wavelength of $\lambda_2=1531$ nm.

Figure 9A:
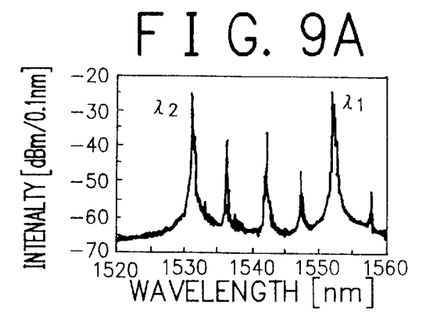
FIG. 9A through FIG. 9D are graphical representations showing time-averaged spectra of the optical output signal (s) of the tunable light source device of FIG. 7.
Figure 9B:
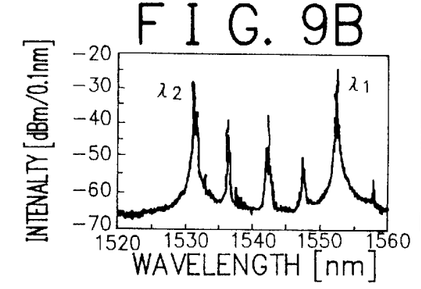
Figure 9C:
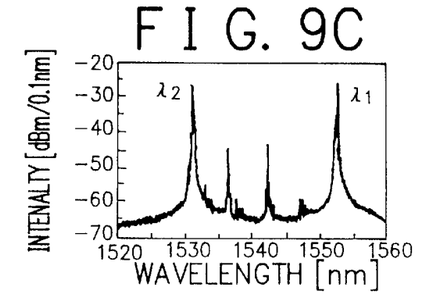
Figure 9D:
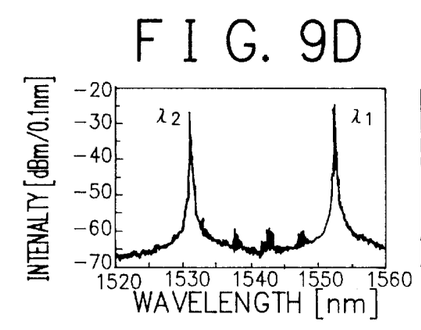
Figure 9E:
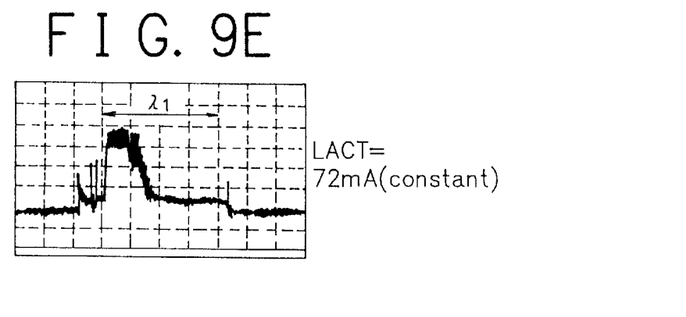
FIG. 9E through FIG. 9H are graphical representations showing time-resolved spectral outputs of the oscillation wavelength of the tunable light source device of FIG. 7.
Figure 9F:
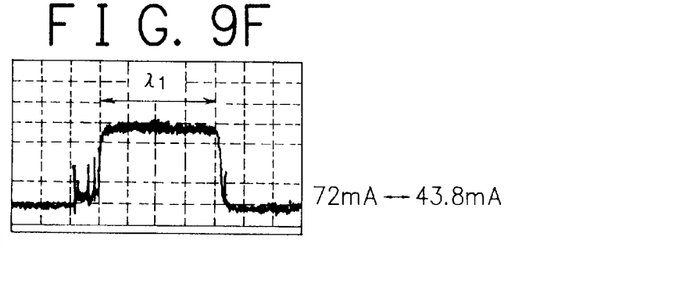
Figure 9G:
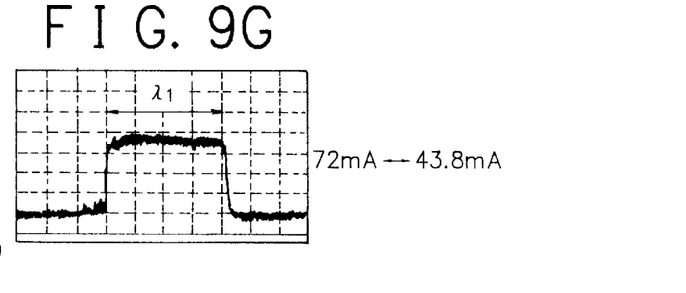
Figure 9H:
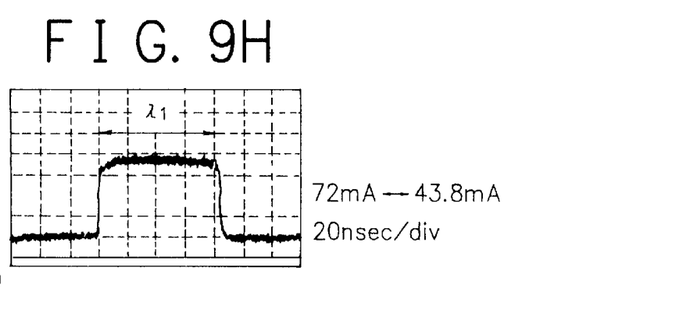

Subsequently, the current supplied to the DBR electrode was switched alternately between 10 mA and 20 mA at a high frequency of 20 MHz. The time-averaged spectrum of the output beam is shown in FIG. 9A. As seen in FIG. 9A, emissions from a plurality of longitudinal mode were observed, showing that the oscillation was trapped in the plurality of modes existing between the wavelength before switching and the wavelength after switching, on the way of passing through the modes. FIG. 9E shows a result of time-resolved spectral analysis of the oscillation beam. Incidentally, this time-resolved spectral analysis is a way of analysis in which intensity of a beam which has passed through a filter for transmitting a specific wavelength is measured, and less variation in the observed waveform shows stability of the laser oscillation wavelength. In FIG. 9E, the wavelength and the power of the oscillation beam output is varying rather irregularly. Therefore, it is obvious that a stable characteristic of wavelength switching could not been obtained by the conventional driving method for tunable semiconductor laser diodes.

Next, cases in which the 3-electrodes tunable DBR laser diode 601 was driven by the driving method of the present invention, i.e. the shadow tuning was executed, will be explained with reference to FIG. 9B through FIG. 9D and FIG. 9F through FIG. 9H. The current supplied to the active layer was decreased during a period of 20 ns on the oscillation wavelength switching (5 ns and 15 ns before and after the moment of switching). The time-averaged spectrums and the time-resolved spectral outputs are shown in FIG. 9B–FIG. 9D and FIG. 9F–FIG. 9H respectively. The lower values of the active layer current supplied to the active region were 43.8 mA, 22.5 mA, and 0 mA respectively. Incidentally, the carrier lifetime in the wavelength control region is approximately 1 ns, and thus both of the periods before and after wavelength switching in which the active layer current is decreased are longer enough than the carrier lifetime.

By the above shadow tuning, sufficient gain for laser oscillation is not obtained at the longitudinal modes which the oscillation wavelength passes through, therefore the longitudinal modes can not cause mode traps. Consequently, emissions from the longitudinal modes existing between the wavelength before switching and the wavelength after switching are gradually inhibited according to the decreasing of the active layer current as shown in FIG. 9B–FIG. 9D. Especially in the case where the active layer current is decreased to 0 mA (FIG. 9D), only two longitudinal modes before and after wavelength switching are observed, showing that a stable wavelength switching could be realized. The stable wavelength switching is also proved by the time-resolved spectral output in FIG. 9H, and the remarkable effectivity of the driving method according to the present invention for realizing stable wavelength switching has been proved as shown above.

Incidentally, although the length of the period in which the active layer current is decreased was set at 20 nm (5 ns+15 ns) in this example, the period can be set shorter, for example a few nanosecond, as long as it is longer enough than the carrier lifetime in the wavelength control region.

As set forth hereinabove, according to the present invention, the active layer current is decreased on wavelength switchings and thereby oscillations at undesirable longitudinal modes are prevented. Therefore, stable wavelength switchings precisely following supplied wavelength control signals are made possible even in a tunable semiconductor laser diode such as a tunable DBR laser diode which involves mode hops in its wavelength tuning characteristic.

Furthermore, extremely high speed wavelength switching of nanosecond order, which is approximately the standard carrier response time in semiconductor laser devices, is made possible, since wavelength switchings precisely following supplied wavelength control signals are made possible.

Moreover, the driving method according to the present invention supplies measures for switching oscillation wavelengths of laser diodes such as tunable DBR laser diodes with high speed and stability, realizing optical wavelength data cell switching and high speed wavelength switching applying wavelength division multiplexing (WDM) technique.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A driving method for a tunable semiconductor laser diode in which an active region and a wavelength control region of the laser are supplied with independent control currents, and the oscillation wavelength of the laser diode is switched by switching a wavelength control current supplied to the wavelength control region, wherein:

the following operation is executed on the switching of the wavelength control current:

the single longitudinal mode laser oscillation of the tunable semiconductor laser diode is temporarily stopped by decreasing an active layer current supplied to the active region below a predetermined value;

then, the wavelength control current is switched; and subsequently, the active layer current is returned to the original value.

2. A driving method for a tunable semiconductor laser diode as claimed in claim 1, wherein the length of the period in which the active layer current is lowered is set longer both before and after the moment of the switching of the wavelength control current than at least the carrier lifetime in the wavelength control region.

3. A driving method for a tunable semiconductor laser diode as claimed in claim 1, wherein the length of the period in which the active layer current is lowered is set longer both before and after the moment of the wavelength switching than at least a period needed for the carrier density variation in the wavelength control region to be stabilized at a stationary state corresponding to an oscillation wavelength after the wavelength control current switching.

4. A driving method for a tunable semiconductor laser diode as claimed in claim 1, wherein the predetermined value of the active layer current is set below threshold currents corresponding to oscillation wavelengths before and after the wavelength control current switching.

5. A driving method for a tunable semiconductor laser diode as claimed in claim 1, wherein the predetermined value of the active layer current is set below threshold currents of all longitudinal modes existing between longitudinal modes corresponding to oscillation wavelengths before and after the wavelength control current switching.

6. A tunable light source device comprising:

a tunable semiconductor laser diode including an active region and a wavelength control region; and a driver means for supplying an active layer current to the active region and supplying a wavelength control current to the wavelength control region respectively, and switching the oscillation wavelength of the laser diode by switching the wavelength control current, wherein the driver means includes a wavelength switching control means for temporarily stopping the single longitudinal mode laser oscillation of the tunable semiconductor laser diode by decreasing the active layer current supplied to the active region below a predetermined value, on the switching of the wavelength control current.

7. A tunable light source device as claimed in claim 6, wherein the wavelength switching control means decreases the active layer current below the predetermined value during a period, in which the length of the period before the moment of the switching of the wavelength control current and the length of the period after the moment of the switching of the wavelength control current are both set longer than at least the carrier lifetime in the wavelength control region.

8. A tunable light source device as claimed in claim 6, wherein the wavelength switching control means decreases the active layer current below the predetermined value during a period, in which the length of the period before the moment of the switching of the wavelength control current and the length of the period after the moment of the switching of the wavelength control current are both set longer than at least a period needed for the carrier density variation in the wavelength control region to be stabilized at a stationary state corresponding to an oscillation wavelength after the wavelength control current switching.

9. A tunable light source device as claimed in claim 6, wherein the wavelength switching control means decreases the active layer current below threshold currents corresponding to oscillation wavelengths before and after the wavelength control current switching.

10. A tunable light source device as claimed in claim 6, wherein the wavelength switching control means decreases the active layer current below threshold currents of all longitudinal modes existing between longitudinal modes corresponding to oscillation wavelengths before and after the wavelength control current switching.

11. A tunable light source device as claimed in claim 6, wherein the tunable semiconductor laser diode is a tunable distributed Bragg reflector semiconductor laser diode.

12. A driving method for a tunable light source device which is provided with:

a first and a second tunable semiconductor laser diodes in each of which an active region and a wavelength control region of the laser diode are supplied with independent control currents and the oscillation wavelength of the laser is switched by switching a wavelength control current supplied to the wavelength control region;

a first and a second optical gate switches for transmitting/absorbing light output signals from the first and the second tunable semiconductor lasers respectively; and an optical combiner for combining the light output signals from the first and the second optical gate switches and outputting the combined, wherein:

on the switching of the oscillation wavelength of the first tunable semiconductor laser diode, a driving control circuit controls to keep the oscillation wavelength of the second tunable semiconductor laser diode fixed, and controls to keep the first and the second optical gate switches in the absorbing state and the transmitting state respectively, on the switching of the oscillation wavelength of the second tunable semiconductor laser diode, the driving control circuit controls to keep the oscillation wavelength of the first tunable semiconductor laser diode fixed, and controls to keep the first and the second optical gate switches in the transmitting state and the absorbing state respectively, wherein:

on the switching of the wavelength control current of either of the first and the second tunable semiconductor laser diode, the following operation is further executed in the tunable semiconductor laser diode whose wavelength control current is switched:

the single longitudinal mode laser oscillation of the tunable semiconductor laser diode is temporarily stopped by decreasing an active layer current supplied to the active region below a predetermined value;

then, the wavelength control current is switched; and subsequently, the active layer current is returned to the original value.

13. A driving method for a tunable light source device as claimed in claim 12, wherein:

the wavelength switching of the first tunable semiconductor laser diode is executed with a predetermined period, the wavelength switching of the second tunable semiconductor laser diode is executed with the same period and with a shifted phase by half of the period compared to the first tunable semiconductor laser, and the switchings of the transmitting/absorbing states of the first and the second optical gate switches are executed so that the first and the second optical gate switches become in the transmitting state alternately with a period of the length of half the predetermined period.

14. A driving method for a tunable light source device as claimed in claim 12, wherein the length of the period in which the active layer current is lowered is set longer both before and after the moment of the switching of the wavelength control current than at least the carrier lifetime in the wavelength control region.

15. A driving method for a tunable light source device as claimed in claim 12, wherein the length of the period in which the active layer current is lowered is set longer both before and after the moment of the switching of the wavelength control current than at least a period needed for the carrier density variation in the wavelength control region to be stabilized at a stationary state corresponding to an oscillation wavelength after the wavelength control current switching.

16. A driving method for a tunable light source device as claimed in claim 12, wherein the predetermined value of the active layer current is set below threshold currents corresponding to oscillation wavelengths before and after the wavelength control current switching.

17. A driving method for a tunable light source device as claimed in claim 12, wherein the predetermined value of the active layer current is set below threshold currents of all longitudinal modes existing between longitudinal modes corresponding to oscillation wavelengths before and after the wavelength control current switching.

18. A tunable light source device comprising:

a first and a second tunable semiconductor laser diodes each of which including an active region and a wavelength control region;

a first and a second optical gate switches for transmitting/absorbing light output signals from the first and the second tunable semiconductor laser diodes respectively;

an optical combiner for combining the light output signals from the first and the second optical gate switches and outputting the combined laser beam; and a driving control circuit for controlling the oscillation wavelengths of the first and the second tunable semiconductor laser diodes and the transmitting/absorbing states of the first and the second optical gate switches, wherein:

on the switching of the oscillation wavelength of the first tunable semiconductor laser diode, the driving control circuit controls to keep the oscillation wavelength of the second tunable semiconductor laser diode fixed, and controls to keep the first and the second optical gate switches in the absorbing state and the transmitting state respectively, on the switching of the oscillation wavelength of the second tunable semiconductor laser diode, the driving control circuit controls to keep the oscillation wavelength of the first tunable semiconductor laser diode fixed, and controls to keep the first and the second optical gate switches in the transmitting state and the absorbing state respectively, and the driving control circuit includes a wavelength switching control means for temporarily stopping the single longitudinal mode laser oscillation of the first tunable semiconductor laser diode by decreasing an active layer current supplied to an active region of the laser diode below a predetermined value on the switching of a wavelength control current of the first tunable semiconductor laser diode, and temporarily stopping the single longitudinal mode laser oscillation of the second tunable semiconductor laser diode by decreasing an active layer current supplied to an active region of the laser below a predetermined value on the switching of a wavelength control current of the second tunable semiconductor laser diode.

19. A tunable light source device as claimed in claim 18, wherein the wavelength switching control means executes the wavelength switching of the first tunable semiconductor laser diode with a predetermined period, executes the wavelength switching of the second tunable semiconductor laser diode with the same period and with a shifted phase by half of the period compared to the first tunable semiconductor laser diode, and executes the switchings of the transmitting/absorbing states of the first and the second optical gate switches so that the first and the second optical gate switches become in the transmitting state alternately with a period of the length of half the predetermined period.

20. A tunable light source device as claimed in claim 18, wherein the length of the period in which the active layer current is decreased by the wavelength switching control means is set longer both before and after the moment of the switching of the wavelength control current than at least the carrier lifetime in the wavelength-control region.

21. A tunable light source device as claimed in claim 18, wherein the length of the period in which the active layer current is decreased by the wavelength switching control means is set longer both before and after the moment of the switching of the wavelength control current than at least a period needed for the carrier density variation in the wavelength control region to be stabilized at a stationary state corresponding to an oscillation wavelength after the wavelength control current switching.

22. A tunable light source device as claimed in claim 18, wherein the wavelength switching control means decreases the active layer current below threshold currents corresponding to oscillation wavelengths before and after the wavelength control current switching.

23. A tunable light source device as claimed in claim 18, wherein the wavelength switching control means decreases the active layer current below threshold currents of all longitudinal modes existing between longitudinal modes corresponding to oscillation wavelengths before and after the wavelength control current switching.

24. A tunable light source device as claimed in claim 18, wherein the first and the second tunable semiconductor laser diodes are tunable distributed Bragg reflector semiconductor laser diodes.

* * * * *